(12) United States Patent
Murayama et al.

(10) Patent No.: US 9,595,625 B2
(45) Date of Patent: Mar. 14, 2017

(54) NANOPARTICLE MATERIAL AND LIGHT-EMITTING DEVICE

(71) Applicant: Murata Manufacturing Co., Ltd., Nagaokakyo-shi, Kyoto-fu (JP)

(72) Inventors: Koji Murayama, Nagaokakyo (JP); Haruya Miyata, Nagaokakyo (JP)

(73) Assignee: MURATA MANUFACTURING CO., LTD., Nagaokakyo-shi, Kyoto-fu (JP)

( * ) Notice: Subject to any disclaimer, the term of this patent is extended or adjusted under 35 U.S.C. 154(b) by 0 days.

(21) Appl. No.: 15/096,696

(22) Filed: Apr. 12, 2016

(65) Prior Publication Data

US 2016/0225947 A1    Aug. 4, 2016

Related U.S. Application Data

(63) Continuation of application No. PCT/JP2014/077585, filed on Oct. 16, 2014.

(30) Foreign Application Priority Data

Oct. 17, 2013 (JP) ................................ 2013-216634

(51) Int. Cl.
- *H01L 33/00* (2010.01)
- *H01L 31/0352* (2006.01)
- (Continued)

(52) U.S. Cl.
CPC .... *H01L 31/035218* (2013.01); *C01B 19/007* (2013.01); *C09K 11/565* (2013.01); *C09K 11/883* (2013.01); *H01L 33/06* (2013.01); *H01L 51/502* (2013.01); *H01L 51/5004* (2013.01); *H05B 33/14* (2013.01); *B82Y 20/00* (2013.01); *B82Y 30/00* (2013.01); *C01P 2004/04* (2013.01); *C01P 2004/64* (2013.01); *C01P 2004/80* (2013.01); *H01L 31/028* (2013.01); *H01L 31/0296* (2013.01);
(Continued)

(58) Field of Classification Search
CPC ............. H01L 31/035218; H01L 33/06; H01L 31/0296; H01L 31/0304; H01L 31/028
See application file for complete search history.

(56) References Cited

U.S. PATENT DOCUMENTS 6,751,243 B2    6/2004   Mukai
8,089,061 B2    1/2012   Kobayashi et al.
(Continued)

FOREIGN PATENT DOCUMENTS

CN    101461285 A    6/2009
CN    101834277 A    9/2010
(Continued)

OTHER PUBLICATIONS

International Search Report issued for PCT/JP2014/077585, date of mailing Jan. 27, 2015.
(Continued)

*Primary Examiner* — Michele Fan
(74) *Attorney, Agent, or Firm* — Arent Fox LLP

(57) ABSTRACT

Quantum dots (nanoparticle material) each having a core-shell structure including a core part and a shell part that protects the core part. The shell part of the quantum dot has a thickness T of 3 to 5 ML based on the constituent molecule of the shell part. A light-emitting device includes the quantum dots.

6 Claims, 15 Drawing Sheets

(51) Int. Cl.
*C09K 11/56* (2006.01)
*C09K 11/88* (2006.01)
*C01B 19/00* (2006.01)
*H05B 33/14* (2006.01)
*H01L 33/06* (2010.01)
*H01L 51/50* (2006.01)
*B82Y 20/00* (2011.01)
*B82Y 30/00* (2011.01)
*H01L 31/028* (2006.01)
*H01L 31/0296* (2006.01)
*H01L 31/0304* (2006.01)

(52) U.S. Cl.
CPC ........ *H01L 31/0304* (2013.01); *H01L 51/504* (2013.01); *H01L 2251/558* (2013.01)

(56) References Cited

U.S. PATENT DOCUMENTS

| | | | |
|---|---|---|---|
| 8,330,142 B2 | 12/2012 | Cho et al. | |
| 8,361,823 B2 | 1/2013 | Kahen | |
| 9,169,435 B2 | 10/2015 | Guo et al. | |
| 2002/0075924 A1 | 6/2002 | Mukai | |
| 2005/0054004 A1* | 3/2005 | Alivisatos | B82Y 15/00 435/7.1 |
| 2006/0068154 A1 | 3/2006 | Parce et al. | |
| 2007/0034833 A1 | 2/2007 | Parce et al. | |
| 2007/0162263 A1 | 7/2007 | Forrest | |
| 2008/0020235 A1 | 1/2008 | Parce et al. | |
| 2008/0122341 A1* | 5/2008 | Orita | B82Y 20/00 313/503 |
| 2008/0206565 A1 | 8/2008 | Takahashi et al. | |
| 2009/0001349 A1 | 1/2009 | Kahen | |
| 2009/0121190 A1 | 5/2009 | Parce et al. | |
| 2009/0242871 A1* | 10/2009 | Kobayashi | C09K 11/025 257/13 |
| 2010/0140551 A1 | 6/2010 | Parce et al. | |
| 2010/0213437 A1 | 8/2010 | Akai et al. | |
| 2010/0213438 A1* | 8/2010 | Cho | B82Y 20/00 257/13 |
| 2011/0006285 A1* | 1/2011 | Lifshitz | C09K 11/025 257/15 |
| 2012/0068118 A1 | 3/2012 | Parce et al. | |
| 2014/0001405 A1* | 1/2014 | Guo | C09K 11/883 252/301.33 |
| 2014/0014896 A1* | 1/2014 | Chung | H01L 33/14 257/13 |
| 2014/0284549 A1* | 9/2014 | Liu | C09D 11/52 257/13 |
| 2015/0183939 A1* | 7/2015 | Lequeux | A61K 49/0067 436/501 |

FOREIGN PATENT DOCUMENTS

| | | | | |
|---|---|---|---|---|
| CN | 104520228 A | 4/2015 | | |
| JP | 2002184970 A | 6/2002 | | |
| JP | 2009520358 A | 6/2002 | | |
| JP | 2006185985 A | 7/2006 | | |
| JP | 2008214363 A | 9/2008 | | |
| JP | 200987744 A | 4/2009 | | |
| JP | 2009544805 A | 12/2009 | | |
| JP | 2010532409 A | 10/2010 | | |
| JP | 2011076726 A | 4/2011 | | |
| JP | 2011252117 A | 12/2011 | | |
| JP | 201219155 A | 1/2012 | | |
| WO | WO 2008013780 A2 * | 1/2008 | ............ | B82Y 20/00 |
| WO | WO 2008120626 A1 | 10/2008 | | |
| WO | WO 2009081919 A1 | 7/2009 | | |
| WO | WO 2012128173 A1 | 9/2012 | | |

OTHER PUBLICATIONS

Qingjiang Sun et al, "Bright, multicoloured light-emitting diodes based on Quantum dots", Nature photonics, vol. 1 (2007), 717-722.

Seth Coe et al, "Electroluminescence from single monolayers of nanocrystals in molecular organic devices", Nature 420, 800-803 (Dec. 19, 2002).

Seth Coe-Sullivan et al, "Tuning the performance of hybrid organic/inorganic quantum dot light-emitting devices", Organic Electronics 4 (2003), 123-130.

Written Opinion of the International Searching Authority issued for PCT/JP2014/077585, date of mailing Jan. 27, 2015.

* cited by examiner

FIG. 18 - PRIOR ART

FIG. 19 - PRIOR ART
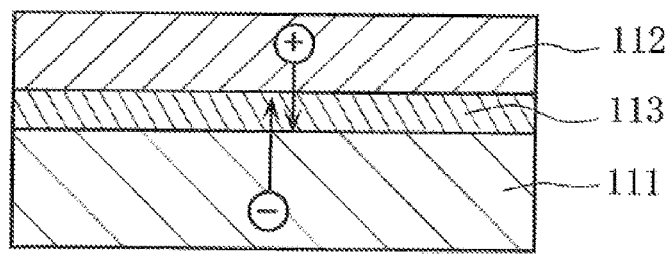
FIG. 20 - PRIOR ART
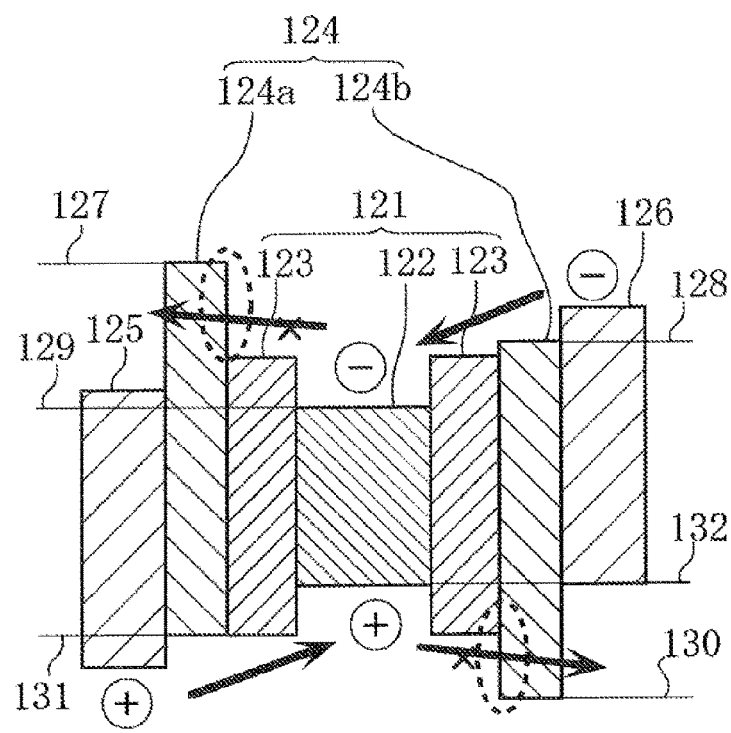

FIG. 21 - PRIOR ART
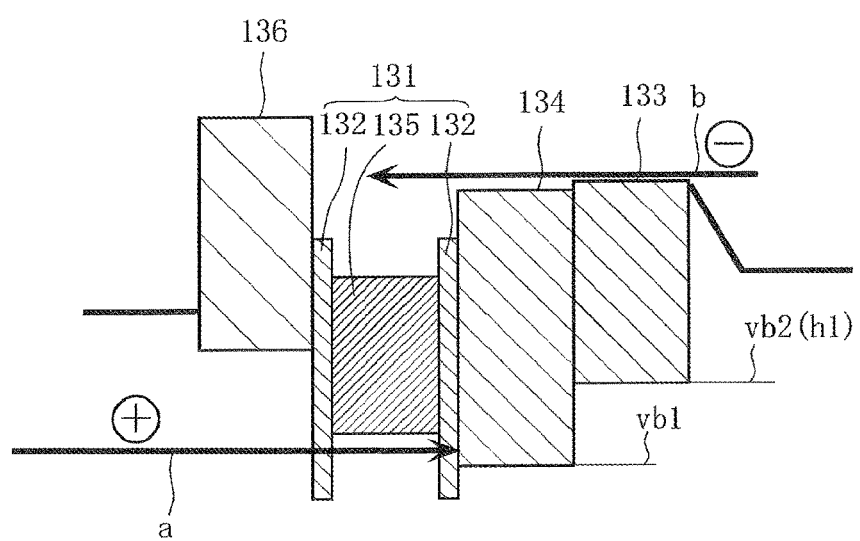

NANOPARTICLE MATERIAL AND LIGHT-EMITTING DEVICE

CROSS REFERENCE TO RELATED APPLICATIONS

The present application is a continuation of International application No. PCT/JP2014/077585, filed Oct. 16, 2014, which claims priority to Japanese Patent Application No. 2013-216634, filed Oct. 17, 2013, the entire contents of each of which are incorporated herein by reference.

FIELD OF THE INVENTION

The present invention relates to a nanoparticle material and a light-emitting device, more specifically, to a nanoparticle material that has a core-shell structure, and a light-emitting device such as an EL element (EL: Electro Luminescence) with a light-emitting layer formed with the use of the nanoparticle material.

BACKGROUND OF THE INVENTION

Quantum dots that are nanoparticles of 10 nm or less in particle size have excellent performance of confining carriers (electrons, holes), and can thus easily produce excitons by recombination of electrons and holes. For this reason, luminescence from free excitons can be expected, and it is possible to realize luminescence which has a high luminescent efficiency and a sharp emission spectrum. In addition, the quantum dots are able to be controlled in a wide range of wavelengths by using the quantum size effect, and thus attracting attention for applications to light-emitting devices such as EL elements, light emitting diodes (LED), and semiconductor lasers.

It is considered important for this type of light-emitting device to confine and recombine carriers in the quantum dots (nanoparticles) with high efficiency, thereby increasing the luminescent efficiency. Further, a self-assembly (self-organization) method of preparing quantum dots by a dry process is known as a method for preparing the quantum dots.

The self-assembly method is a method of causing gas-phase epitaxial growth of a semiconductor layer under such a specific condition that provides lattice mismatch, and causing self-formation of three-dimensional quantum dots with the use of the strain thereof. For example, when strain is produced from a difference in lattice constant between an n-type semiconductor substrate and a p-type semiconductor layer and epitaxial growth cannot be caused, a quantum dot is formed at the site with the strain produced.

However, in the self-assembly method, quantum dots are discretely distributed on the n-type semiconductor substrate, and gaps are thus produced between the adjacent quantum dots. For this reason, there is a possibility that holes transported from the p-type semiconductor layer will be transported toward the n-type semiconductor substrate without being injected into the quantum dots, or electrons transported from the n-type semiconductor substrate will be transported to the p-type semiconductor substrate without being injected into the quantum dots, and there is a possibility of causing a decrease in luminescent efficiency.

Moreover, in the self-assembly method mentioned above, there is a possibility that carriers that are not injected into the quantum dots will recombine to produce luminescence outside the quantum dots. Then, when carriers recombine to produce luminescence outside the quantum dots in such a manner, there is a possibility of producing more than one intensity peak and causing a decrease in purity of luminescent color. In addition, even when carriers that are not injected into the quantum dots recombine outside the quantum dots, the recombination does not produce luminescence and may result in non-luminescent recombination centers, and in such cases, electrical energy is released as thermal energy without being converted to light energy, and there is thus a possibility of causing a further decrease in luminescent efficiency.

Therefore, Patent Document 1 proposes a semiconductor device including a substrate with a main surface composed of a first semiconductor, a plurality of quantum dots discretely distributed on the main surface, a coating layer composed of a second semiconductor formed on the surface with the quantum dots distributed, and a barrier layer formed from a third semiconductor or an insulating material that is disposed on at least a part of the region without the quantum dots disposed in the plane with the quantum dots distributed and that has a larger bandgap than the bandgaps of the first and second semiconductors.

That is, in Patent Document 1, as illustrated in FIG. 18, n-type GaAs (first semiconductor) is used to form a substrate 101, and p-type GaAs (second semiconductor) is used to form a coating layer 102. In addition, quantum dots 103 composed of InGaAs are discretely distributed on the substrate 101 with the use of a self-assembly method, AlAs (third semiconductor) that has higher bandgap energy than GaAs is further epitaxially grown on the substrate 101 with the use of a molecular beam epitaxy method, and thereafter the AlAs is oxidized to form an insulating barrier layer 104.

In such a manner, in Patent Document 1, the gaps between the quantum dots 103 are filled with the insulating barrier layer 104 to thereby make carriers easy to inject into the quantum dots 103, and promote the recombination of electrons and holes in the quantum dots 103, thereby making an improvement in luminescent efficiency.

On the other hand, Patent Document 2 and Patent Document 3 are known as techniques of preparing colloidal quantum dots by a wet process.

Patent Document 2 proposes a light-emitting device including a light-emitting layer composed of quantum dots and emitting light by recombination of electrons and holes, an n-type inorganic semiconductor layer that transports the electrons to the light-emitting layer, a p-type inorganic semiconductor layer that transports the holes to the light-emitting layer, a first electrode for injecting the electrons into the n-type inorganic semiconductor layer, and a second electrode for injecting the holes into the p-type inorganic semiconductor layer.

In Patent Document 2, as illustrated in FIG. 19, an n-type semiconductor layer 111 and a p-type semiconductor layer 112 are formed from inorganic materials that have a band structure with favorable carrier transport properties, and a quantum dot layer 113 is interposed between the n-type semiconductor layer 111 and the p-type semiconductor layer 112.

Then, electrons transported from the n-type semiconductor layer 111 and holes transported from the p-type semiconductor layer 112 are, due to the tunnel effect, injected into the quantum dot layer 113 through potential barriers between the quantum dot layer 113 and the carrier transport layers (the n-type semiconductor layer 111 and the p-type semiconductor layer 112), thereby improving the efficiency of injecting carriers into the quantum dot layer 113.

In addition, Patent Document 3 proposes a nanoparticle luminescent material composed of a core part composed of a nanoparticle and a shell part composed of at least two types of ligands localized on the surface of the core part, where at least one of the ligands is a hole transporting ligand, and at least one thereof is an electron transporting ligand.

In Patent Document 3, with the use of a surfactant with a hole transporting ligand and an electron transporting ligand, the energy levels of each ligand are designed for such a combination that produces a carrier block effect so that carriers are confined in the nanoparticle.

FIG. 20 is a band structure diagram illustrating the energy band in Patent Document 3, where a nanoparticle has a core-shell structure.

That is, the nanoparticle 121 is composed of a core part 122 and a shell part 123 coating the core part 122, and the shell part 123 is coated with a surfactant 124. This surfactant 124 has a hole transporting ligand 124a and an electron transporting ligand 124b, and the hole transporting ligand 124a is localized closer to a hole transport layer 125, and the electron transporting ligand 124b is localized closer to an electron transport layer 126.

In Patent Document 3, the LUMO level 127 of the hole transporting ligand 124a is made higher than the LUMO level 128 of the electron transporting ligand 124b, thereby injecting electrons from the electron transport layer 126 into the core part 122, whereas the LUMO level 127 of the hole transporting ligand 124a is made higher than the lowest electron level 129 in the conduction band (for electron transfer) of the core part 122, thereby causing the hole transporting ligand 124a to serve as a barrier to electrons, and thus, electrons are confined within the core part 122.

Furthermore, in Patent Document 3, the HOMO level 130 of the electron transporting ligand 124b is made lower than the HOMO level 131 of the hole transporting ligand 124a, thereby injecting holes from the hole transport layer 125 into the core part 122, whereas the HOMO level 130 of the electron transporting ligand 124b is made lower than the highest electron level 132 in the conduction band (for hole transfer) of the core part 122, thereby causing the electron transporting ligand 124b to serve as a barrier to holes, and thus, holes are confined within the core part 122.

Here, the LUMO level refers to an energy level corresponding to the lowest unoccupied molecular orbital of molecular orbitals that are not occupied by electrons in the case where molecules irradiated with light bring energy into an excited state and bring the molecular orbitals into an empty state occupied by no electron.

In addition, the HOMO level refers to an energy level corresponding to the highest occupied molecular orbital of molecular orbitals in a ground state in the case where electrons occupy the molecular orbitals in order from the molecular orbitals with the lowest energy in the ground state before molecules are irradiated with light.

In such a manner, in Patent Document 3, due to the electron block effect of the hole transporting ligand 124a and the hole bock effect of the electron transporting ligand 124b, carriers (electrons and holes) are confined within the core part 122 of the nanoparticle 121.

Then, electrons and holes are confined within the core part 122 in such a manner to thereby recombine electrons and holes in the core part 122 and cause excitons to produce luminescence.

Patent Document 1: Japanese Patent Application Laid-Open No. 2002-184970 (claim 1, FIG. 1)
Patent Document 2: Japanese Patent Application Laid-Open No. 2006-185985 (claim 1, FIG. 1)
Patent Document 3: Japanese Patent Application Laid-Open No. 2008-214363 (claims 1 to 5)

SUMMARY OF THE INVENTION

However, in Patent Document 1 (FIG. 18), while crystals have few surface defects because the InGaAs constituting the quantum dots 103 is formed by epitaxial growth, the InGaAs has some of In substituted with Ga, and therefore makes a small difference in bandgap energy between the InGaAs and the GaAs that forms the substrate 101 and the coating layer 102, and has poor performance of confining carriers.

That is, in the case of using the quantum dots for a light-emitting layer of a light-emitting device, there is a need to effectively confine holes and electrons in the quantum dots 103, recombine the holes and the electrons in the quantum dots 103, and cause excitons to produce luminescence.

However, in the Patent Document 1, since the difference in bandgap energy is small between the InGaAs that forms the quantum dots 103 and the GaAs that forms the substrate 101 and the coating layer 102, there is a possibility that without recombination of holes transported from a hole transport layer and electrons transported from an electron transport layer in the quantum dots 103, the holes will be transported to the electron transport layer side, and the electrons will be transported to the hole transport layer side, thereby resulting in poor performance of confining carriers into the quantum dots 103.

In addition, in Patent Document 2 (FIG. 19), while the efficiency of injecting carriers into the quantum dot layer 113 is improved by the use of the tunnel effect, it is difficult to effectively confine carriers in the quantum dot layer 113, and thus there has been a problem that the carrier recombination probability is poor and a sufficient luminescent efficiency cannot be obtained.

In addition, in Patent Document 3 (FIG. 20), while the function of confining carriers in the nanoparticle 121 is improved by adjusting the energy levels of the surfactant 124 and the core part 122 of the nanoparticle 121 as mentioned above, a surfactant material and a core material have to be selected such that a certain difference in energy level is provided between the surfactant 124 and the core part 122, the materials are restricted largely, and the degree of freedom for design is also low.

In addition, in this type of light-emitting device, in order to achieve further improved emission characteristics, there is a need to not only effectively confine carriers in the nanoparticle 121, but also improve the efficiency of injecting carriers into the nanoparticle 121 (quantum dot). However, Patent Document 3 makes no mention of the foregoing respect, but further improved characteristics have been demanded.

On the other hand, as a measure for improving the function of confining carriers, it is also conceivable to interpose a hole block layer 134 between a shell part 132 and an electron transport layer 133 as illustrated in FIG. 21.

That is, in FIG. 21, a quantum dot 131 that forms a light-emitting layer has a core-shell structure including a core part 135 and a shell part 132.

Then, the quantum dot 131 is interposed between a hole transport layer 136 and the electron transport layer 133, and between the shell part 132 and the electron transport layer 133, the hole block layer 134 is interposed which is formed from an electron transporting material such that the energy level vb1 of a valence band on the basis of a vacuum level is lower than the energy level vb2 of the valence band of the electron transport layer 133 or the HOMO level h1 of the electron transport layer 133.

In the light-emitting device configured in such a manner, as indicated by an arrow a, holes injected from the hole transport layer 136 into the quantum dot 131 can be prevented from leaking to the outside of the quantum dot 131, such as the electron transport layer 133, while the hole block layer 134 serves as a barrier. That is, the interposition of the hole block layer 134 with a predetermined energy level between the shell part 132 and the electron transport layer 133 is considered to retain and accumulate holes in the core part 135, thus making it possible to be efficiently recombine, in the core part 135, the holes with electrons injected from the electron transport layer 133 into the quantum dot 131, as indicated by an arrow b.

However, in the light-emitting device in FIG. 21, there is a need to newly provide the hole block layer 134 between the quantum dot 131 and the electron transport layer 133, and there is a possibility of increasing the number of steps in the manufacturing process, or increasing the cost. Moreover, in order to effectively block holes so as to keep the holes from leaking to the outside, the hole block layer 134 needs to have a predetermined energy level as described above, and an electron transport property, and thus the material is also restricted largely, and there is a possibility of causing new problems.

The present invention has been made in view of these circumstances, and an object of the present invention is to provide a nanoparticle material which suppresses the leakage of holes injected into the nanoparticle material to the outside of the nanoparticle material to improve the recombination probability, thereby making it possible to improve the luminescent efficiency and the purity of luminescent color, and a light-emitting device that uses the nanoparticle material for a light-emitting layer.

In nanoparticles that have a core-shell structure, shell parts are formed mainly for removing surface defects of core parts to inactivate the surfaces, and thus typically formed from a material that is higher in bandgap energy than the core parts.

Therefore, hole blocking performance is able to be improved by increasing the thickness of the shell part to the extent that carrier transport properties and the like are not damaged.

The present inventors have earnestly carried out research from the foregoing perspective and have found that if the thickness of the shell part is made 3 to 5 monolayers (hereinafter, referred to as "ML") on the basis of the constituent molecule of the shell part, it possible to improve hole blocking performance while avoiding a decrease in carrier transport properties as much as possible, without generating any surface defect due to lattice mismatch between a nanoparticle material and the core material, and even when the nanoparticle material is used for a light-emitting layer of a light-emitting device.

The present invention has been made on the basis of this finding, and a nanoparticle material according to the present invention has a core-shell structure including a core part and a shell part coating the core part, and the shell part has a thickness of 3 to 5 ML based on the constituent molecule of the shell part.

Here, the ML (monolayer) on the basis of the constituent molecule refers to the average number of particles in the thickness direction of the closest packed nanoparticles in the material, and for example, the term of 1 ML means a monomolecular layer.

In addition, in the nanoparticle material according to the present invention, the shell part preferably has a lower energy level of valence band on the basis of a vacuum level than an energy level of a valence band of the core part.

Thus, holes injected from the outside to the nanoparticle material can be blocked effectively by the shell part. Therefore, the hole block function can be ensured without the need to newly provide any constituent member such as a hole block layer.

In addition, a light-emitting device according to the present invention is a light-emitting device including a light-emitting layer that has quantum dots of core-shell structure including a core part and a shell part, and emitting light with an electric current injected into the light-emitting layer, and the quantum dots are formed from the nanoparticle material according to any of the foregoing.

Thus, the leakage of holes to the outside is blocked by the shell parts of the quantum dots, and the holes are thus retained and accumulated in the core part, thereby improving the recombination probability and emitting light with high efficiency. In addition, since the leakage of holes to the outside is blocked, the recombination in an adjacent layer such as an electron transport layer and the generation of non-luminescent recombination can be suppressed, thereby dramatically improving the luminescent efficiency, and making it possible to obtain a light-emitting device which has a favorable purity of luminescent color.

Moreover, the shell part is originally higher in bandgap energy than the core part, and the energy level of the valence band on the basis of the vacuum level of the shell part is thus lower than that of the core part. As a result, the device is also not restricted by the shell material or other materials. That is, since the hole blocking performance can be ensured by only adjusting the thickness of the shell part in the range mentioned above, it becomes possible to realize a light-emitting device which has a high degree of freedom for design, and also has excellent productivity.

In addition, in the light-emitting device according to the present invention, preferably, the light-emitting layer is interposed between a hole transport layer and an electron transport layer, and the shell part has a lower energy level of a valence band on the basis of a vacuum level than the energy level of the valence band of the electron transport layer or the HOMO level of the electron transport layer.

Thus, even when the electron transport layer has no hole block function, the leakage of holes to the outside of the quantum dots can be prevented by the hole block function of the shell part.

In addition, in the light-emitting device according to the present invention, the light-emitting layer preferably has a thickness of 0.5 to 2 ML on the basis of the particle size of the first quantum dot.

Here, the ML (monolayer) on the basis of the particle size refers to the number of layers in the case of converting the particle of the quantum dot to an equivalent film thickness, and for example, corresponds to 0.5 ML when quantum dots are present at only about half a density in a plane.

The migration distance of carriers can be shortened by defining the thickness of the light-emitting layer in such a manner, and thus the decrease in the injection efficiency of carriers into quantum dots can be avoided as much as possible, even when the surface of the shell part is coated with an insulating surfactant.

In addition, in the light-emitting device according to the present invention, preferably, the quantum dots include a first quantum dot formed from the nanoparticle material according to any of the foregoing, and a second quantum dot that has a core-shell structure with a shell part of less than 3 ML in thickness on the basis of a constituent molecule of the shell part, the light-emitting layer has a stacked structure including a first light-emitting layer formed from the first quantum dot and a second light-emitting layer formed from the second quantum dot, and the first light-emitting layer is disposed closer to the electron transport layer, and the second light-emitting layer is disposed closer to the hole transport layer.

This combination of the first quantum dot with the second quantum dot that has the thin shell part of less than 3 ML in thickness improves the tunneling transport properties of carriers, thereby making it possible to realize a high-efficiency light-emitting device which has a low drive voltage and an excellent hole block function.

The nanoparticle material according to the present invention has the core-shell structure including the core part and the shell part coating the core part, and the shell part has a thickness of 3 to 5 ML on the basis of the constituent molecule of the shell part, and thus has an adequate thickness. Thus, even when the nanoparticle material is used for a light-emitting layer of a light-emitting device, the hole blocking performance can be improved while a decrease in carrier transport properties is avoided as much as possible, without generation of any surface defect due to lattice mismatch between the nanoparticle material and the core material.

In addition, the light-emitting device according to the present invention includes the light-emitting layer that has quantum dots of core-shell structure including the core part and the shell part, and emits light with an electric current injected into the light-emitting layer, and the quantum dots are formed from the nanoparticle material according to any of the foregoing. Thus, since the leakage of holes to the outside is blocked by the shell part of the quantum dots, the holes are retained and accumulated in the core part, thereby improving the recombination probability of electrons and holes, and emitting light with high efficiency. In addition, since the leakage of holes to the outside is blocked as described above, the recombination in an adjacent layer such as an electron transport layer and the generation of non-luminescent recombination can be suppressed, thereby dramatically improving the luminescent efficiency, and making it possible to obtain a light-emitting device which has a favorable purity of luminescent color.

Moreover, the shell part is originally higher in bandgap energy than the core part, and the energy level of the valence band on the basis of the vacuum level of the shell part is thus lower than that of the core part. As a result, the device is also not restricted by the shell material or other materials. That is, since the hole blocking performance can be ensured by only adjusting the thickness of the shell part in the range mentioned above, it becomes possible to realize a light-emitting device which has a high degree of freedom for design, and also has excellent productivity.

BRIEF EXPLANATION OF THE DRAWINGS

FIG. 18 is a cross-sectional view for explaining the prior art described in Patent Document 1.

FIG. 19 is a cross-sectional view for explaining the prior art described in Patent Document 2.

FIG. 20 is a band diagram illustrating a confinement principle for carriers in Patent Document 3.

FIG. 21 is a band diagram in the case of interposing a hole block layer between a shell part and an electron transport layer.

DETAILED DESCRIPTION OF THE INVENTION

Next, embodiments of the present invention will be described in detail.

First Embodiment

Figure 1:
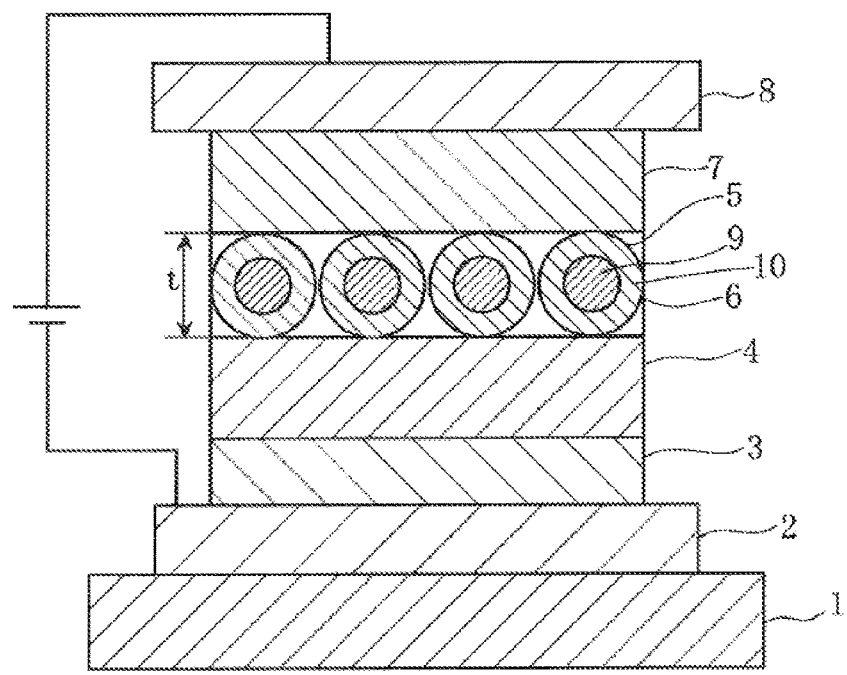
FIG. 1 is a cross-sectional view schematically illustrating a first embodiment of an EL element as a light-emitting device according to the present invention.

FIG. 1 is a cross-sectional view schematically illustrating a first embodiment of an EL element as a light-emitting device according to the present invention, where a light-emitting layer is formed from a nanoparticle material according to the present invention.

That is, this EL element has an anode 2 formed on a transparent substrate 1 such as a glass substrate, a hole injection layer 3 and a hole transport layer 4 composed of hole transporting materials sequentially formed on the surface of the anode 2, and a light-emitting layer 6 with a thickness t formed on the surface of the hole transport layer 4. In addition, an electron transport layer 7 composed of an electron transporting material is formed on the surface of the light-emitting layer 6, and a cathode 8 is formed on the surface of the electron transport layer 7.

Then, in the light-emitting layer 6, quantum dots 5 that is a nanoparticle material according to the present invention are aligned in a matrix.

Figure 2:
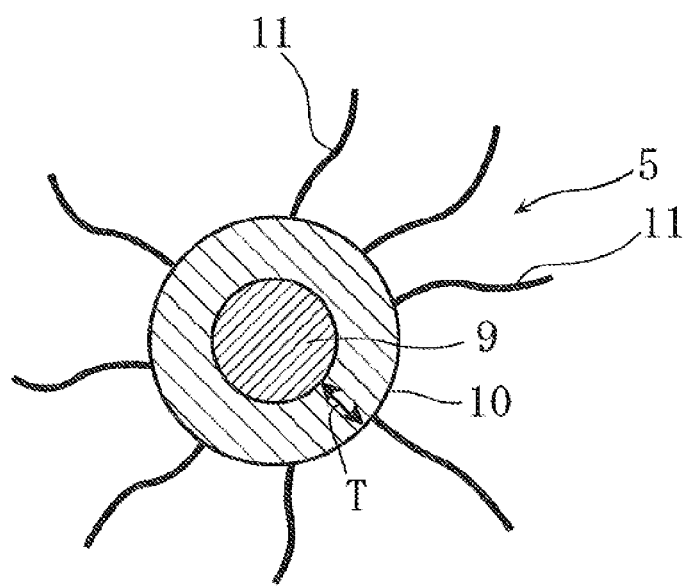
FIG. 2 is a cross-sectional view schematically illustrating a nanoparticle material (first quantum dot) according to the present invention.

The quantum dot 5 is, as illustrated in FIG. 2, composed of a core-shell structure including a core part 9 and a shell part 10 that protects the core part 9, and the surface of the shell part 10 is coated with a surfactant 11, thereby avoiding agglomeration of the quantum dots with one another. Then, holes transported from the hole transport layer 4 and electrons transported from the electron transport layer 7 are injected into the quantum dots 5, and recombined in the core part 9 to cause excitons to produce luminescence.

It is to be noted that the light-emitting layer 6 is illustrated with the surfactant 11 omitted in FIG. 1.

The shell part 10 of the quantum dot 5 has a thickness T of 3 to 5 ML on the basis of the constituent molecule of the shell part 10.

Here, the ML on the basis of the constituent molecule refers to the average number of particles in the thickness direction of the closest packed nanoparticles in the material. For example, in a case where the surface of the core part 9 is coated with a shell material to form the shell part 10, when an average value of the number of particles in the thickness direction of the shell part 10 is "3" in the closest packing of nanoparticles to serve as the shell material, the ML corresponds to "3 ML on the basis of the constituent molecule of the shell part 10," and when an average value of the number of particles in the thickness direction of the shell part 10 is "5", the ML corresponds to "5 ML on the basis of the constituent molecule of the shell part 10."

In the present embodiment, the thickness T of the shell part 10 is 3 to 5 ML on the basis of the constituent molecule of the shell part 10, thereby causing the shell part 10 to exhibit a hole block function. That is, the shell part 10 exhibits the hole block function, thereby making it possible to suppress the leakage of holes injected from the hole transport layer 10 into the quantum dot 5 to the outside of the quantum dot 5, and thus the holes can be effectively confined in the quantum dot 5, thereby making it possible to promote the recombination of electrons and holes in the quantum dots 5, and make improvements in luminescent efficiency and purity of luminescent color.

Figure 3:
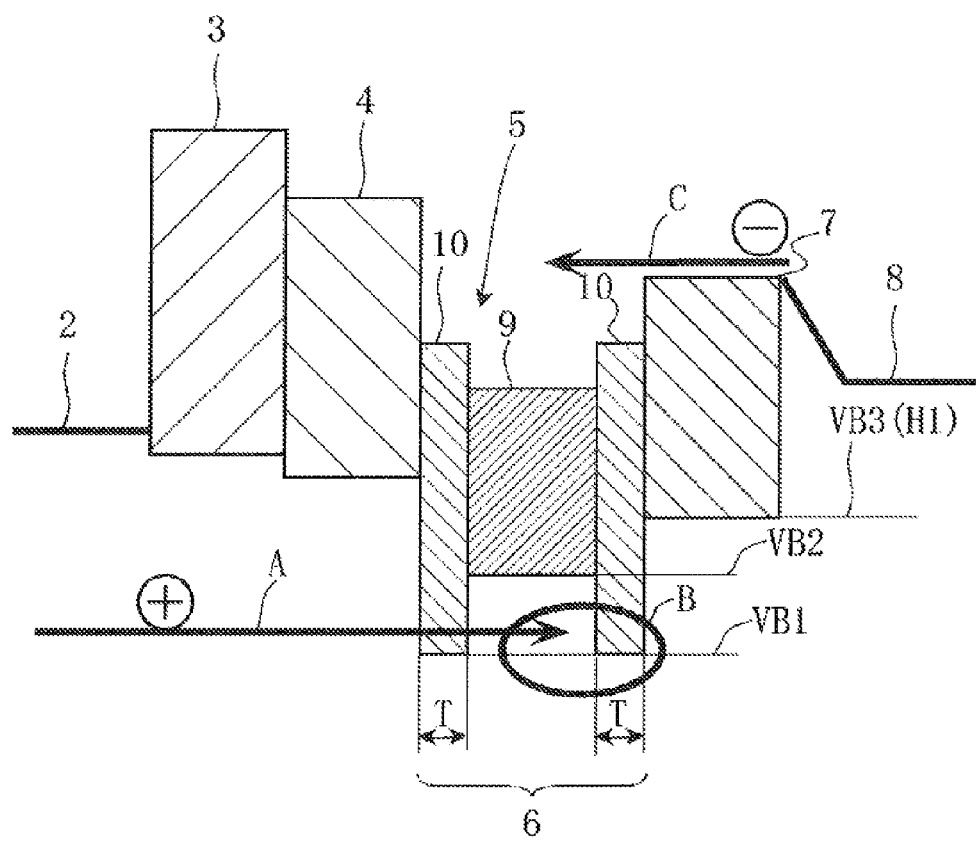
FIG. 3 is a band structure diagram illustrating an energy band according to the first embodiment.

FIG. 3 is a band structure diagram illustrating an energy band of the EL element.

The energy level VB1 of a valence band on the basis of a vacuum level of the shell part 10 is lower than the energy level VB2 of a valence band of the core part 9. That is, the shell part 10 is formed mainly for inactivating surface defects of the core part 9, and thus formed with the use of a material that is larger in bandgap energy Eg than that of the core part 9.

In order to efficiently inject carriers from the carrier transport layers (hole transport layer 4 and electron transport layer 7) into the quantum dots 5, it is preferable for the carriers to pass through the shell part 10 with the use of a tunneling resonance. Then, to that end, it is considered desirable that the thickness T of the shell part 10 be formed into a thin film as possible. For this reason, conventionally, the shell part 10 has typically been formed such that the thickness T thereof is 1 to 2 ML on the basis of the constituent molecule of the shell part 10, or approximately 0.2 to 0.6 nm in film thickness.

However, when the thickness T of the shell part 10 is made extremely small, there is a possibility that holes injected into the quantum dot 5 will pass through the shell part 10 without being recombined with electrons in the quantum dot 5, and leak to the outside of the electron transport layer 7 or the like, thereby causing a decrease in luminescent efficiency. In addition, the holes leaking to the outside of the quantum dot 5 have the possibility of recombining with electrons, for example, in the electron transport layer 7 which is an adjacent layer, and in such a case, luminescence is not produced in the absorption wavelength range of the quantum dot 5, but luminescence is produced in the absorption wavelength range of the electron transport layer 7 which is an adjacent layer, and there is thus a possibility of causing a decrease in purity of luminescent color. Furthermore, even when the recombination has been achieved, there is a possibility that non-luminescent recombination will cause a further decrease in luminescent efficiency.

Accordingly, in order to keep the hole block function in the shell part 10, the thickness T of the shell part 10 is desirably made appropriately thick, and thus the leakage of holes to the outside of the quantum dot 5 is considered to be able to be suppressed without any restriction in terms of material.

Therefore, the present inventors have earnestly made studies by trial and error, and have found that the thickness T of the shell part 10 is made 3 ML or more on the basis of the constituent molecule of the shell part 10, thereby making it possible to ensure the hole block function in the shell part 10.

On the other hand, when the thickness T of the shell part 10 increases to exceed 5 ML on the basis of the constituent molecule of the shell part 10, the thickness T of the shell part 10 becomes excessively large, and for this reason, there is a possibility that lattice mismatch will be caused between the core material and the shell material, thereby increasing surface defects due to the lattice mismatch. In addition, when the thickness T of the shell part 10 increases to exceed 5 ML, there is a possibility that the tunneling resonance of carriers into the quantum dot 5 will make the injection difficult to decrease the recombination probability, thereby causing a decrease in luminescent efficiency.

Therefore, the thickness T of the shell part 10 is 3 to 5 ML on the basis of the constituent molecule of the shell part 10 in the present first embodiment.

In such a manner, in the present embodiment, since the thickness T of the shell part 10 is 3 to 5 ML on the basis of the constituent molecule of the shell part 10, surface defects of the core part 9 are maintained inactivated by the shell part 10, and holes can be, through tunneling resonances, injected efficiently from the hole transport layer 4 to the quantum dot 5 as indicated by an arrow A, whereas electrons can be, through tunneling resonances, injected efficiently from the electron transport layer 7 to the quantum dot 5 as indicated by an arrow C. Then, the leakage of holes injected into the quantum dot 5 to the outside of the electron transport layer 7 or the like can be suppressed by the hole block function of the shell part 10 formed to be 3 to 5 ML in thickness T (as denoted by B in the figure). As a result, the holes are retained and accumulated in the core part 9, and thus, while the increase in the thickness T of the shell part 10 slightly increases the drive voltage and also slightly decreases the luminance, the probability of recombination with electrons in the core part 9 improves, thereby making it possible to dramatically improve the luminescent efficiency. Furthermore, the recombination probability in the electron transport layer 7 which is an adjacent layer is suppressed, thus also making it possible to improve the purity of luminescent color.

It is to be noted that according to the present invention, the relationship between the energy levels of the shell part 10 and electron transport layer 7 is not particularly limited, and the scope of the present invention also encompasses, for example, a case where the energy level VB1 of the valence band on the basis of the vacuum level of the shell part 10 is higher than the energy level VB3 of the valence band of the electron transport layer 7 or the HOMO level H1 of the electron transport layer 7.

However, as illustrated in FIG. 3, when the energy level VB1 of the valence band on the basis of the vacuum level of the shell part 10 is lower than the energy level VB3 of the valence band of the electron transport layer 7 or the HOMO level H1 of the electron transport layer 7, the electron transport layer 7 is able to serve also to provide a hole block function, which is particularly effective, and more preferred.

Then, the core material that forms the core part 9 is not particularly limited as long as the core material is a material that produces luminescence in a visible light region, and CdSe, CdTe, ZnSe, ZnTe, InP, InAs, GaP, GaAs, ZnS:CuInS, ZnS:CuInGaS, Si, Ge, and the like can be used as the core material.

In addition, as the shell material that forms the shell part, materials can be used which have a higher bandgap energy Eg than that of the core material such that the energy level VB1 of the valence band on the basis of the vacuum level is lower than the energy level VB2 of the valence band of the core material. For example, sulfides such as ZnS and CdS, oxides such as ZnO, $SiO_2$, $TiO_2$, and $Al_2O_3$, nitrides such as GaN and AlN and selenides such as ZnSe and CdSe can be selected appropriately and used depending on the core material.

In addition, the electron transporting material that forms the electron transport layer 7 is also not particularly limited, but from the perspective of transporting electrons generated in the cathode 8 efficiently to the quantum dots 5 (light-emitting layer 6), there is preferably no electron transport barrier, or the barrier is as low as possible, and preferably materials can be used which have a lower LUMO level than the work function of the cathode 8 or the LUMO level of the core part 9 on the basis of the vacuum level.

Then, such an electron transporting material can be selected appropriately and used from among, for example, tris(8-hydroxyquinoline)aluminum (Alq3), 2,9-dimethyl-4,7-diphenyl-1,10-phenanthroline (BCP), 2-(4-biphenylyl)-5-(4-t-butylphenyl)-1,3,4-oxadiazole (PBD), 2,2',2"-(1,3,5-benzonitrile)-tris(1-phenyl-1-H-benzoimidazole (TPBi), 3-(benzothiazole-2-yl)-7-(diethylamino)-2H-1-benzopyran-2-on (coumarin 6), bis(2-methyl-8-quinolinolato)-4-(phenylphenolato)aluminum (BAlq), 4,4'-bis(9-carbazolyl)-2,2'-dimethylbiphenyl (CDBP), and derivatives thereof.

In addition, as for the hole transporting materials that form the hole injection layer 3 and the hole transport layer 4, from the perspective of transporting holes generated in the anode 2 efficiently to the quantum dots 5 (light-emitting layer 6), there is preferably no electron hole barrier, or the barrier is as low as possible, and preferably materials can be used which have a HOMO level between the work function of the anode 2 and the HOMO level of the core part 9 on the basis of the vacuum level.

Then, such a hole transporting material can be selected appropriately and used from among, for example, poly(3,4-ethylenedioxythiophene):poly(styrenesulfonate) (PEDOT:PSS), N,N'-diphenyl-N,N'-bis(3-methylphenyl)-1,1'-biphenyl-4,4'-diamine (TPD), 4,4'-bis[N-(1-naphthyl)-N-phenyl-amino]biphenyl ($\alpha$-NPD), 4,4',4"-tris(2-naphthylphenylamino)triphenylamine (2-TNATA), N,N'-7-di(1-naphthyl)-N,N'-diphenyl-4,4'-diaminobiphenyl (Spiro-NPB), 4,4',4"-tris(3-methylphenylphenylamino)triphenylamine (m-MTDATA), and derivatives thereof.

It is to be noted that while the surfactant 11 is not particularly limited, but organic compounds having a bulky polar group, for example, surfactants with a polar group bonded to alkyl groups of long-chain amines such as hexadecylamine (hereinafter, referred to as "HDA") and octadecylamine, trioctylphosphine, trioctylphosphine oxide, an oleic acid, and a myristic acid can be used preferably from the perspective of dispersibility and efficient inactivation of surface defects of the quantum dot 5, and the polar group is coordinated as a ligand on the surface of the shell part 10.

In addition, in the present embodiment, the thickness t of the light-emitting layer 6 is not particularly limited, but is preferably 0.5 to 2 ML on the basis of the particle size of the quantum dot 5 in consideration of carrier transport properties.

Here, the ML on the basis of the particle size refers to the number of layers in the case of converting the particle of the quantum dot to an equivalent film thickness. For example, when particles are present at only about half a density in a plane, the ML corresponds to "0.5 ML on the basis of the particle size of the quantum dot 5," and when two particles are present on average, the ML corresponds to "2 ML on the basis of the particle size of the quantum dot 5."

For the surfactant 11, an electron transporting or hole transporting material is sometimes used, but typically, an insulating material such as HDA is often used.

However, due to the fact that this insulating surfactant 11 is poor in carrier transport property, there is a possibility of causing a decrease in the carrier transport property, when the light-emitting layer 6 is multi-layered to exceed 2 ML and there is any quantum dots 5 that are not in contact with the hole transport layer 4 or the electron transport layer 7.

However, when the thickness t of the light-emitting layer 6 becomes less than 0.5 ML, the thickness of the light-emitting layer 6 becomes excessively small, thereby extremely reducing the interval between the hole transport layer 4 and the electron transport layer 7, and for this reason, light is totally reflected around the boundaries of the both layers, and in particular, in a region that is low in current density, there is a possibility of making it impossible to sufficiently extract light energy to the outside.

Therefore, the thickness t of the light-emitting layer 6 is preferably 0.5 to 2 ML on the basis of the particle size of the quantum dot 5, in particular, when an insulating material is used as the surfactant 11.

In the EL element formed in such a manner, carriers are injected into the anode 2 and the cathode 8 when a voltage is applied between the anode 2 and the cathode 8. The holes injected into the anode 2 and the electrons injected into the cathode 8 are injected into the quantum dots 5 through a bulk-hetero network of the surfactant 11.

Then, the leakage of the holes to the outside is blocked by the shell 10 having the thickness T of 3 to 5 ML on the basis of the constituent molecule of the shell part 10, thereby retaining and accumulating the holes in the core part 9, improving the recombination probability, and producing luminescence with high efficiency. In addition, since the leakage of the holes to the outside is blocked as described above, the recombination in adjacent layers such as the electron transport layer and the generation of non-luminescent recombination can be suppressed, thereby making it possible to obtain an EL element with a dramatically improved luminescent efficiency and a favorable purity of luminescent color.

Moreover, the hole block function can be ensured by only adjusting the thickness of the shell part to the range mentioned above, thereby making it possible to realize a light-emitting device which has a high degree of freedom for design and also excellent productivity.

Next, a method for manufacturing the EL element mentioned above will be described.

First, a quantum dot dispersing solution is prepared.

While various materials can be used as described above as the quantum dots 5, a case of using CdSe for the core part 9 and ZnS for the shell part 10 will be described as an example in the present first embodiment.

That is, for example, cadmium oxide, stearic acid, and octadecene weighed in predetermined amounts are mixed in a container, and stirred while being heated to a predetermined temperature (for example, 100° C.) under reduced pressure. Then, this solution is sufficiently stirred while being heated to a predetermined temperature (for example, 200° C.) under a reducing atmosphere, and thereafter, cooled to room temperature. Then, with the addition of trioctylphosphine oxide (TOPO) and octadecene thereto, the solution is stirred while being heated to a predetermined temperature (for example, 100° C.) under reduced pressure, thereby preparing a cadmium-containing precursor solution.

On the other hand, selenium, octadecene, and tributylphosphine (hereinafter, referred to as "TBP") are mixed in a contained, and heated to a predetermined temperature (for example, 100° C.), thereby preparing a selenium-containing precursor solution.

Then, the cadmium-containing precursor solution is heated to a predetermined temperature (for example, 280° C.) in a reducing atmosphere, and when the selenium-containing precursor solution at a low temperature (for example, on the order of 100° C.) is injected into this heated solution, the precursor solutions react with each other to form nuclei of CdSe. Thereafter, the temperature is caused to naturally decrease to a predetermined temperature or less (for example, 250° C. or less). It is to be noted that no new nucleus is formed at this stage.

Then, the temperature is caused to increase to a predetermined temperature (for example, 250° C. or lower), and while this predetermined temperature is maintained, the solution is sufficiently stirred. Then, the nuclei of CdSe are nanocrystallized by growing, and at the same time, improving in crystallinity, thereby preparing a CdSe quantum dot solution.

Next, a zinc oxide precursor solution of zinc oxide dissolved in oleic acid and octadecene, and a sulfur precursor solution of sulfur dissolved in octadecene are prepared.

Next, the zinc oxide precursor solution and the sulfur precursor solution are dropped every predetermined interval (for example, 20 minutes) into the CdSe quantum dot solution adjusted to a predetermined temperature (for example, 240° C.), and heated and stirred to form, on the surfaces of the CdSe quantum dots, ZnS to serve as shells. Thereafter, a poor solvent such as acetone or methanol is used for precipitation, and the operation for centrifugation is carried out to remove impurities in the solution. Thereafter, a CdSe/ZnS dispersing solution with a ZnS film thickness of 3 to 5 ML on the basis of the constituent molecule of ZnS, that is, a quantum dot dispersing solution is prepared by dispersion in a non-polar solvent, for example, toluene or chloroform while a desired surfactant such as HDA is added.

It is to be noted that the thickness of the ZnS film to serve as the shell part 10 can be controlled easily by adjusting the concentrations of the zinc oxide precursor solution, sulfur precursor solution, and CdSe quantum dot solution, and further, the dropping frequencies and dropping amounts of the respective precursor solutions.

FIGS. 4(a) to 4(c) and 5(d) to 5(f) are manufacturing process diagrams illustrating a method for manufacturing the light-emitting device mentioned above.

Figure 4A:
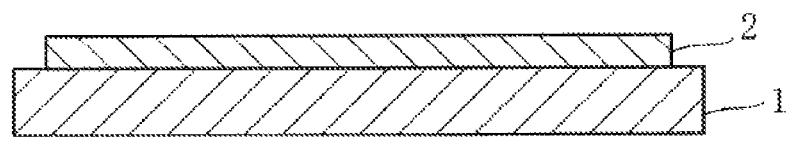
FIGS. 4(a) to 4(c) are manufacturing process diagrams (1/2) illustrating a method for manufacturing the light-emitting device.

First, as illustrated in FIG. 4(a), a conductive transparent material such as an ITO is deposited by a sputtering method on the transparent substrate 1 such as a glass substrate, and subjected to UV-ozone treatment to form the anode 2 of 100 nm to 150 nm in film thickness.

Next, a hole injection layer solution is prepared. The same material as the hole transporting material can be used as a material for the hole injection layer, and for example, PEDOT:PSS or the like can be used.

Figure 4B:

Then, a spin coating method or the like is used to apply the hole injection layer solution onto the anode 2, thereby forming the hole injection layer 3 of 20 nm to 30 nm in film thickness as illustrated in FIG. 4(b).

Next, a hole transport layer solution is prepared which has a lower energy level in HOMO level than the hole injection layer material. For example, when PEDOT:PSS is used, poly-TPD or the like that is lower in HOMO level than the PEDOT:PSS can be used as a material for the hole injection layer.

Figure 4C:
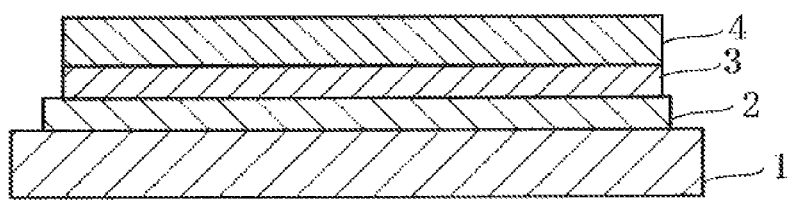

Then, a spin coating method or the like is used to apply the hole transport layer solution onto the positive electrode injection layer 3, thereby forming the hole transport layer 4 of 60 nm to 70 nm in film thickness as illustrated in FIG. 4(c).

It is to be noted that since the hole injection layer 3 mentioned above is provided to improve the hole transport property, the hole transport layer 4 may also serve as the hole injection layer 3, and in this case, the hole transport layer 4 can be formed only from poly-TPD, and the hole injection layer 3 can be omitted.

Next, the quantum dot dispersing solution described above is prepared.

Figure 5D:
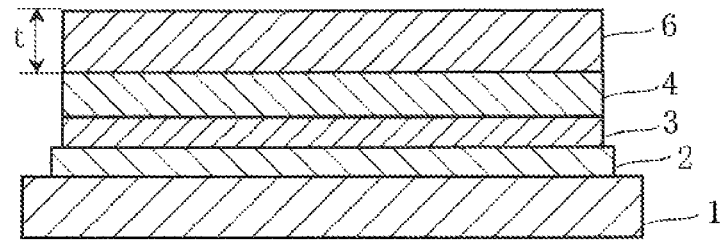
FIGS. 5(d) to 5(f) are manufacturing process diagrams (2/2) illustrating the manufacturing method according to the first embodiment.

Then, a spin coating method or the like is used to apply the quantum dot dispersing solution onto the hole transport layer 4, and the solution is subjected to drying under a $N_2$ atmosphere to form the light-emitting layer 6 of preferably 0.5 to 2 ML in thickness t as illustrated in FIG. 5(d).

Figure 5E:
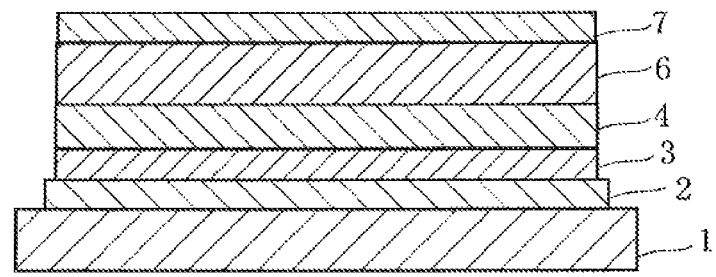

Next, an electron transporting material such as Alq3 is used to form, by a vacuum deposition method, the electron transport layer 7 of 50 nm to 70 nm in film thickness on the surface of the light-emitting layer 6 as illustrated in FIG. 5(e).

Figure 5F:
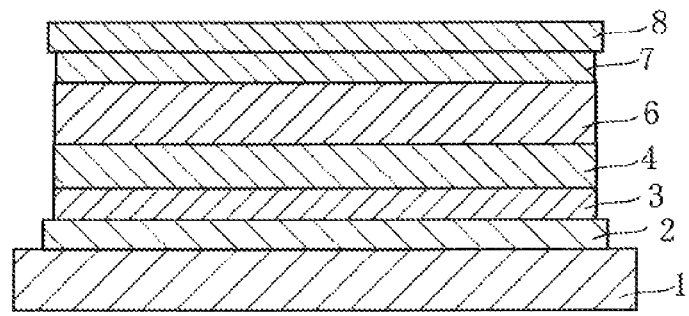

Then, as illustrated in FIG. 5(f), LiF, Al, or the like is used to form, by a vacuum deposition method, to form the cathode 8 of 100 nm to 300 nm in film thickness, thereby preparing an EL element with the quantum dots serving as the light-emitting layer.

In such a manner, according to the present first embodiment, the element can be manufactured inexpensively and efficiently without the need for more than one cumbersome deposition process as in dry processes.

Then, the EL element formed in such a manner can make improvements in luminescent efficiency and purity of luminescent color, because of efficient recombination in the quantum dots 5 as described above.

Second Embodiment

Figure 6:
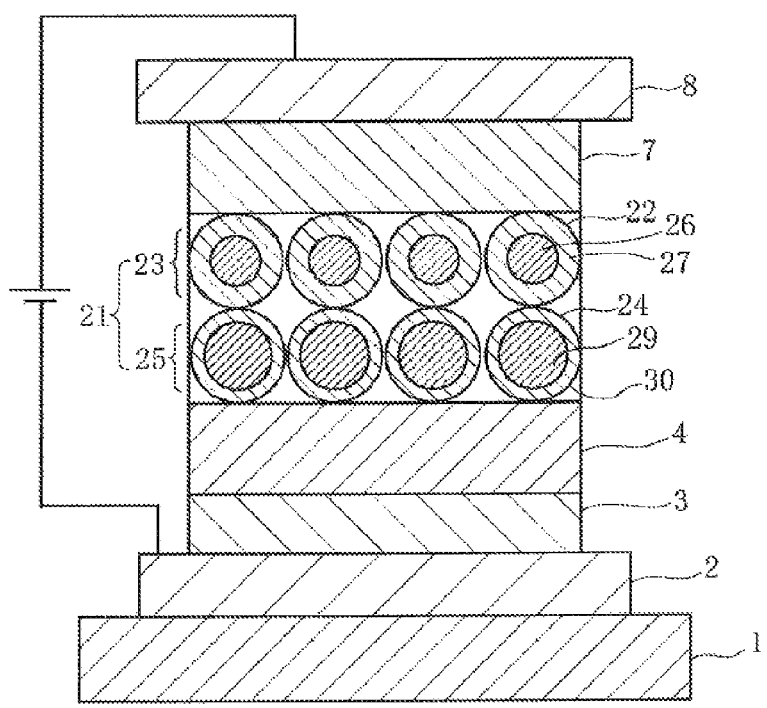
FIG. 6 is a cross-sectional view schematically illustrating a second embodiment.

FIG. 6 is a cross-sectional view schematically illustrating a second embodiment of an EL element as a light-emitting device according to the present invention.

This EL element has a stacked structure where a light-emitting layer 21 has a first light-emitting layer 23 formed from first quantum dots 22 and a second light-emitting layer 25 formed from second quantum dots 24 that are smaller in shell part thickness than the first quantum dots 22.

Figure 7:
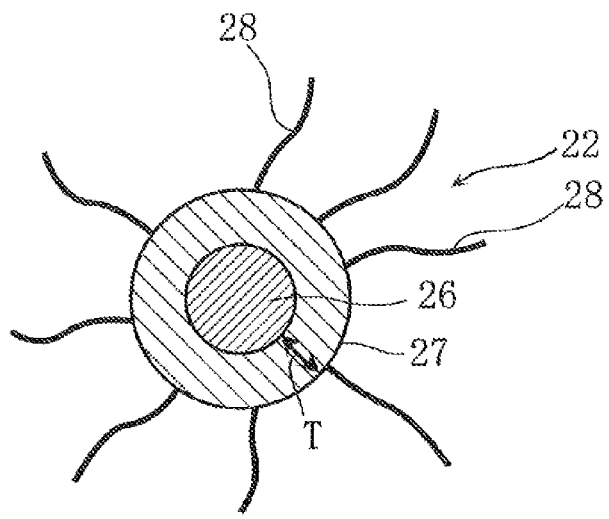
FIG. 7 is a cross-sectional view schematically illustrating a first quantum dot according to the second embodiment.

The first quantum dot 22 has, specifically as illustrated in FIG. 7, the same form as in the first embodiment, and a shell part 27 is formed on the surface of a core part 26, while the surface of the shell part 27 is coated with a surfactant 28, and the thickness T of the shell part 27 is 3 to 5 ML on the basis of the constituent molecule of the shell part 27.

Figure 8:
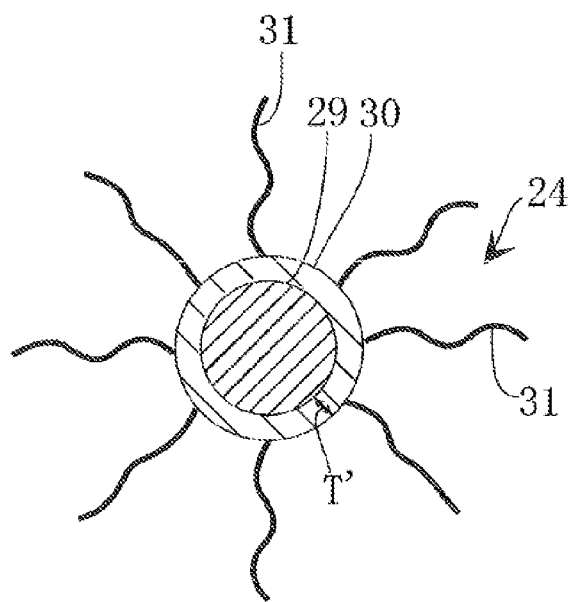
FIG. 8 is a cross-sectional view schematically illustrating a second quantum dot according to the second embodiment.

In addition, the second quantum dot 24 has, as illustrated in FIG. 8, a core-shell structure composed of a core part 29 and a shell part 30 coating the core part 29, and the surface of the shell part 30 is coated with a surfactant 31, while the thickness T' of the shell part 30 is less than 3 ML on the basis of the constituent molecule of the shell part 30. It is to be noted that as long as the thickness T' of the shell part 30 is less than 3 ML, the lower limit is not particularly limited, but typically from the perspective of sufficient inactivation of surface defects, the shell part 30 is formed to have the thickness T' of 1 ML or more.

In such a manner, in the present second embodiment, the first quantum dots 22 with the shell parts 27 of 3 to 5 ML in thickness T on the basis of the constituent molecule of the shell part 27 are aligned in the form of a layer to form the first light-emitting layer 23, and the first light-emitting layer 23 is disposed closer to an electron transport layer 7. In addition, the second quantum dots 24 with the shell parts 30 of less than 3 ML in thickness T' on the basis of the constituent molecule of the shell part 30 are aligned in the form of a layer to form the second light-emitting layer 25, and the second light-emitting layer 25 is disposed closer to a hole transport layer 4.

Figure 9:
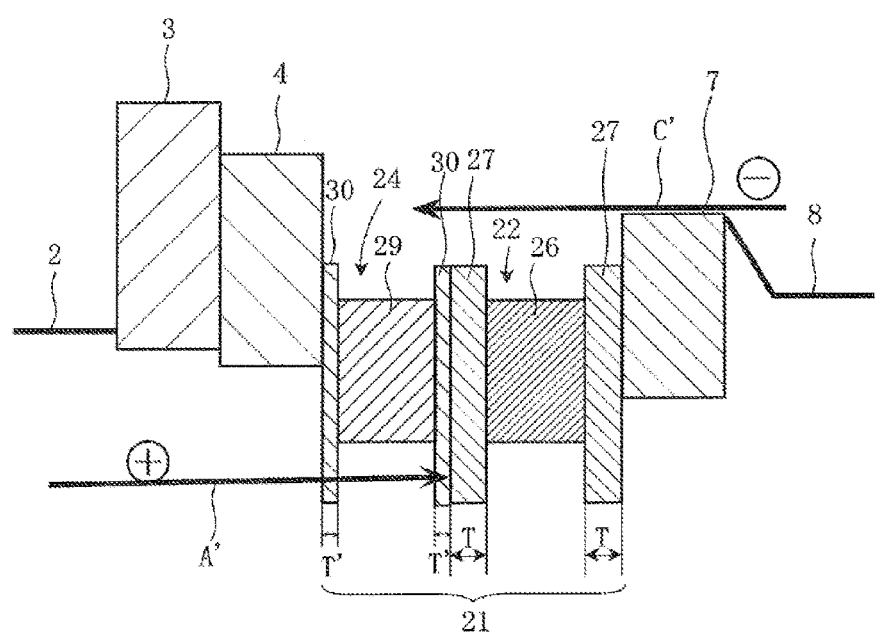
FIG. 9 is a band structure diagram illustrating an energy band according to the second embodiment.

FIG. 9 is a band structure diagram illustrating an energy band according to the second embodiment.

That is, in the present second embodiment, since the thin shell part 30 of the second quantum dot 24 is less than 3 ML in thickness T' on the basis of the constituent molecule of the shell part 30, holes transported from the hole transport layer 4 are, as indicated by an arrow A', injected into the core part 29 by easily passing through the shell part 30 due to tunneling resonances. Then, since the shell parts 27 of the first quantum dots 22 exhibit the hole block function, the holes are retained and accumulated in the first and second quantum dots 22, 24 without leakage to the outside. Then, the holes are recombined with electrons injected from the electron transport layer 7 into the first and second quantum dots 22, 24 as indicated by an arrow C'.

In such a manner, according to the present second embodiment, the first quantum dots 22 with the shell parts 27 of 3 to 5 ML in thickness T are combined with the second quantum dots 24 with the shell parts 30 of less than 3 ML in thickness T', the first light-emitting layer 23 formed from the first quantum dots 22 is disposed closer to the electron transport layer 7, and the second light-emitting layer 25 formed from the second quantum dots 24 is disposed closer to the hole transport layer 4, thus making it possible for the second quantum dots 24 with the shell parts 30 of less than 3 ML in thickness T' to lower the drive voltage and improve the luminance, and making it possible for the first quantum dots 22 with the shell parts 27 of 3 to 5 ML in thickness T to make improvements in luminescent efficiency and purity of luminescent color, and making it possible to realize an EL element including, as light-emitting layers, high-efficiency quantum dots which have various types of excellent light-emitting characteristics.

The EL element according to the second embodiment can be prepared easily as follow.

It is to be noted that while various materials can be used for the first and second quantum dots 22, 24 as in the case of the first embodiment, a case of using CdSe for the core parts 26, 29 and ZnS for the shell parts 27, 30 will be described as an example in the present second embodiment.

That is, first, a first quantum dot dispersing solution for a ZnS film that is the shell part 27 of 3 to 5 ML in thickness T and a second quantum dot dispersing solution for a ZnS film that is the shell part 30 of less than 3 ML in thickness T' are prepared in accordance with the same method and procedures as in the first embodiment.

The thicknesses T, T' of the shell parts 27, 30 can be controlled easily by, as in the case of the first embodiment, adjusting the concentrations of the zinc oxide precursor solution, sulfur precursor solution, and CdSe quantum dot solution, and further, the dropping frequencies and dropping amounts of the respective precursor solutions.

Figure 10A:
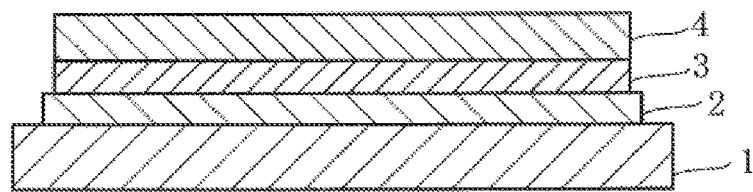
FIGS. 10(a) to 10(c) are manufacturing process diagrams for a manufacturing method according to the second embodiment.
Figure 10B:
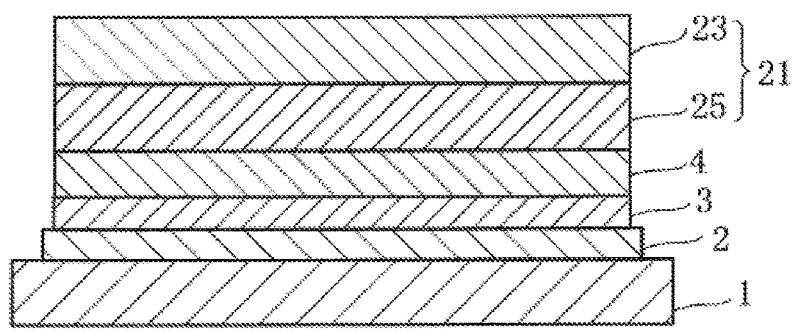
Figure 10C:
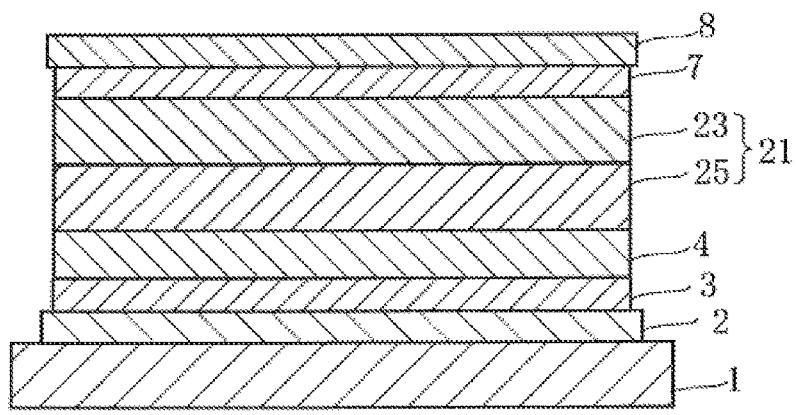

FIGS. 10(a) to 10(c) are manufacturing process diagrams according to the second embodiment.

First, in accordance with the same method and procedure as in the first embodiment, an anode 2, a hole injection layer 3, and the hole transport layer 4 are formed on a transparent substrate 1, as illustrated in FIG. 10(a).

Then, the first quantum dot dispersing solution and the second quantum dot dispersing solution are prepared.

Then, a spin coating method or the like is used to apply the second quantum dot dispersing solution onto the hole transport layer 4, and the solution is subjected to drying under a $N_2$ atmosphere to prepare the second light-emitting layer 25. Then, a spin coating method or the like is used again to apply the first quantum dot dispersing solution onto the second light-emitting layer 25, and the solution is subjected to drying in a $N_2$ atmosphere to prepare the first light-emitting layer 23. Thus, the light-emitting layer 21 composed of the first light-emitting layer 23 and the second light-emitting layer 25 is prepared as illustrated in FIG. 10(b). On this occasion, the thickness of the light-emitting layer 21 is preferably controlled to be 0.5 to 2 ML on the basis of the particle size of the first quantum dot.

Thereafter, in accordance with the same method and procedure as in the first embodiment, the electron transport layer 7 and a cathode 8 are sequentially formed as illustrated in FIG. 10(c), thereby preparing an EL element.

In such a manner, according to the present second embodiment, a high-efficiency EL element which has excellent light-emitting characteristics of low drive voltage, favorable luminance, and favorable luminescent efficiency and purity of luminescent color can be prepared easily by the wet process.

It is to be noted that the present invention is not limited to the embodiments mentioned above. While the compound semiconductor of CdSe/ZnS is used as each quantum dot in the embodiments described above, the same applies to other compound semiconductors, oxides, and single semiconductors.

In addition, while the EL elements where the hole transport layers 4 and electron transport layers 7 adjacent to the light-emitting layers 6, 21 are formed from organic compounds have been described in the embodiments described above, layers formed from inorganic compounds are also applicable, and also in this case, the leakage of carriers to the adjacent layers can be suppressed, and high-quality light-emitting devices with a favorable recombination probability in the quantum dots can be manufactured inexpensively and with high efficiency.

In addition, it is obvious that the present invention can be used for, besides EL elements, various types of light-emitting devices such as light-emitting diodes, semiconductor lasers, and various types of display devices.

In addition, the electron transport layer 7 is prepared by the dry process with the use of the vacuum deposition method in the embodiments mentioned above, but may be prepared by a wet process such as a spin coating method. However, in this case, there is a need to use a dispersing solvent with the same polarity as that of the dispersing solution used in the immersion step.

Next, Examples of the present invention will be described specifically.

EXAMPLE 1

Preparation of Sample (Sample Number 1)
(Preparation of Quantum Dot Dispersing Solution)

A quantum dot dispersing solution composed of a core part of CdSe (LUMO level: 4.4 eV, HOMO level: 6.5 eV) and a shell part of ZnS (LUMO level: 3.9 eV, HOMO level: 7.4 eV) was prepared.

That is, a cadmium oxide and a stearic acid were weighed to provide the cadmium oxide: 1.6 mmol and the stearic acid: 6.4 mmol. Then, the cadmium oxide and the stearic acid were put into a round-bottom flask with octadecene: 16 mL retained therein, and mixed in the octadecene. Then, this mixture was stirred with a stirring bar for 30 minutes while being heated to 100° C. under reduced pressure, further stirred with a stirring bar for 1 hour while being heated to 200° C. under a nitrogen atmosphere, and cooled to room temperature. Thereafter, to this solution, TOPO: 4 g and octadecylamine: 12 g were added, and the solution was again stirred with a stirring bar for 30 minutes while being heated to 100° C. under reduced pressure, thereby preparing a Cd-containing precursor solution.

Next, Se and TBP were weighed to provide Se: 16 mmol and TBP: 18.1 mmol, mixed in octadecene: 13.89 mL, and heated to 100° C., thereby preparing a Se-containing precursor solution.

Next, the Cd-containing precursor solution was heated to 280° C. in a nitrogen atmosphere, and the temperature was cased to naturally decrease to 250° C. or lower while the total amount (about 18.6 mL) of the Se-containing precursor solution at ordinary temperature was injected through a syringe to form nuclei of CdSe. Thereafter, the temperature was caused to increase to 250° C., and further while the temperature of 250° C. was kept, a stirring bar was used for stirring for 90 minutes to grow nanocrystals (quantum dots), thereby preparing a CdSe quantum dot solution.

Next, octadecylamine: 3 mL and octadecene: 9 mL were put into another round-bottom flask, heated at a temperature of 100° C. for 60 minutes under reduced pressure, stirred, and thereafter returned to ordinary temperature. Then, 4.5 mL of the CdSe quantum dot solution was separated and injected thereto, and stirred at a temperature of 100° C. for 30 minutes under reduced pressure. Thus, the octadecylamine was coordinated on the surfaces of the CdSe quantum dots to inactivate surface defects, thereby preparing a CdSe quantum dot dispersing solution with dispersibility increased.

Next, sulfur: 13 mmol was sufficiently mixed with octadecene: 10 mL to prepare a sulfur precursor solution, and 1 mmol of zinc oxide, oleic acid: 4 mmol, and octadecene: 10 mL were sufficiently mixed to prepare a zinc oxide precursor solution.

Next, the CdSe quantum dot dispersing solution was heated to 240° C., the sulfur precursor solution: 2.25 mL was injected, then after 20 minutes, the zinc oxide precursor solution: 2.25 mL was injected, and thereafter, the solutions were heated and stirred for 60 minutes to form shell parts composed of ZnS on the surfaces of the core parts composed of CdSe. Thereafter, treatment with acetone was carried out, and the operation for centrifugation was further carried out to remove impurities in the solution.

Thereafter, the solution was dispersed in toluene while HDA was added to the solution, thereby coating the surfaces with the HDA, and preparing a core-shell quantum dot dispersing solution composed of CdSe/ZnS with ZnS of 3 ML in shell thickness at a concentration of 1 mg/mL.

(Preparation of Device Sample)

A glass substrate of 25 mm×25 mm was prepared, and on the glass substrate, an ITO film (work function: 4.8 eV) was deposited by a sputtering method, and subjected to UV-ozone treatment to prepare an anode of 120 nm in film thickness.

Next, PEDOT:PSS (LUMO level: 3.1 eV, HOMO level: 5.1 eV) was applied onto the anode with the use of a spin coating method, and subjected to drying to form a hole injection layer of 20 nm in film thickness.

Next, poly-TPD (LUMO level: 2.3 eV, HOMO level: 5.4 eV) was applied onto the hole injection layer with the use of a spin coating method, and subjected to drying to form a hole transport layer of 65 nm in film thickness.

Then, a spin coating method was used to apply the quantum dot dispersing solution onto the hole transport layer to form a light-emitting layer. Specifically, 0.1 mL of the quantum dot dispersing solution was dropped onto the hole transport layer, rotated at rotation frequency: 3000 rpm for 60 seconds, and subjected to drying by heating to 100° C. in a nitrogen atmosphere, thereby preparing the light-emitting layer.

Next, Alq3 (LUMO level: 3.1 eV, HOMO level: 5.8 eV) was deposited on the surface of the light-emitting layer with the use of a vapor deposition method to form an electron transport layer of 50 nm in film thickness.

Then, finally, LiF/Al (work function: 4.3 eV) was deposited with the use of a vapor deposition method to form a cathode of 100 nm in film thickness, thereby preparing a sample of sample number 1.

It is to be noted that as for the sample of sample number 1, according to the observation of a cross section with a TEM, the thickness of the shell part was 3 ML on the basis of the constituent molecule of the shell part, and thickness of the light-emitting layer was 1 ML on the basis of the particle size of the quantum dot.

(Sample Number 2)

In accordance with the same method and procedure as for sample number 1 except that the amounts of the sulfur precursor solution and zinc oxide precursor solution were reduced to ⅓, a quantum dot dispersing solution was prepared. Thereafter, a sample of sample number 2 was prepared in accordance with the same method and procedure as for sample number 1.

It is to be noted that as for the sample of sample number 2, according to the observation of a cross section with a TEM, the thickness of the shell part was 1 ML on the basis of the constituent molecule of the shell part, and thickness of the light-emitting layer was 1 ML on the basis of the particle size of the quantum dot.

(Sample Number 3)

In accordance with the same method and procedure as for sample number 1, a CdSe quantum dot solution was prepared.

Then, the CdSe quantum dot solution was dispersed in toluene while HDA was added to the solution, thereby preparing a quantum dot dispersing solution composed of CdSe with a surface coated with HDA at a concentration of 1 mg/mL.

Thereafter, a sample of sample number 3 was prepared in the same method and procedure as for sample number 1.

It is to be noted that as for the sample of sample number 3, according to the observation of a cross section with a TEM, there was no shell part, and thickness of the light-emitting layer was 1 ML on the basis of the particle size of the quantum dot.

(Evaluation of Sample)

Figure 11:
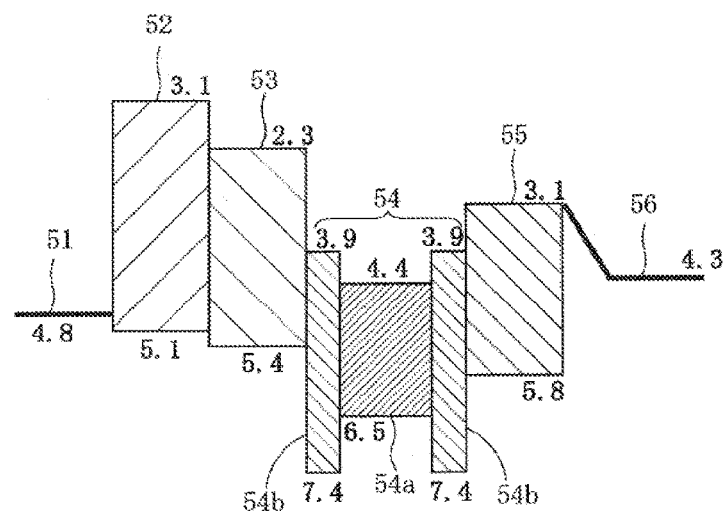
FIG. 11 is a band structure diagram illustrating an energy band for sample numbers 1 and 2 according to Example 1.

FIG. 11 is a band structure diagram illustrating an energy band for sample numbers 1 and 2, and an anode 51, a hole injection layer 52, a hole transport layer 53, a light-emitting layer composed of a quantum dot 54 including a core part 54a and a shell part 54b, an electron transport layer 55, and a cathode 56 are sequentially stacked, and the respective layers have the energy levels illustrated in the figure.

In addition, sample number 3 has the same band structure as in FIG. 11, except for including no shell part 54b.

For each sample of sample numbers 1 to 3, the current density, luminance characteristics, luminescent efficiency, and emission spectrum were measured to evaluate the samples.

First, for each sample, with the use of a multichannel detector (PMA-11 from Hamamatsu Photonics K.K.), direct-current voltage was applied in steps to measure the current density and the luminance at each voltage.

In addition, each external quantum efficiency ηext at the current density obtained as described above was calculated on the basis of formula (1), thereby evaluating the luminescent efficiency.

$$\eta ext = \gamma \cdot \eta int \cdot \eta out \quad (1)$$

In this formula, ηint represents an internal quantum efficiency, and represents the proportion of recombination of an electron and a hole in a quantum dot, that is, the proportion of photons that contribute to exciton luminescence. γ represents a carrier balance factor between a hole and an electron, and ηout represents a light extraction efficiency for light extracted externally.

That is, the external quantum efficiency next is the external quantum efficiency obtained by multiplying the internal quantum efficiency ηint by the light extraction efficiency ηout and the carrier balance γ, and accordingly, when the external quantum efficiency next is large, the luminescent efficiency improves.

It is to be noted that the internal quantum efficiency ηint is calculated from the number of injected electrons which is calculated from the current density, and the number of luminescent photons by measuring the number of luminescent photons.

In addition, the emission spectrum was measured by the following method.

That is, each sample was placed in an integrating sphere, a direct-current voltage was applied to cause the sample to emit light at a luminance of 100 cd/m² with the use of a constant-current power source (2400 from Keithley Instruments Inc.), the emitted light is collected by the integrating sphere, and an emission spectrum was measured with the multichannel detector mentioned above.

Figure 12:
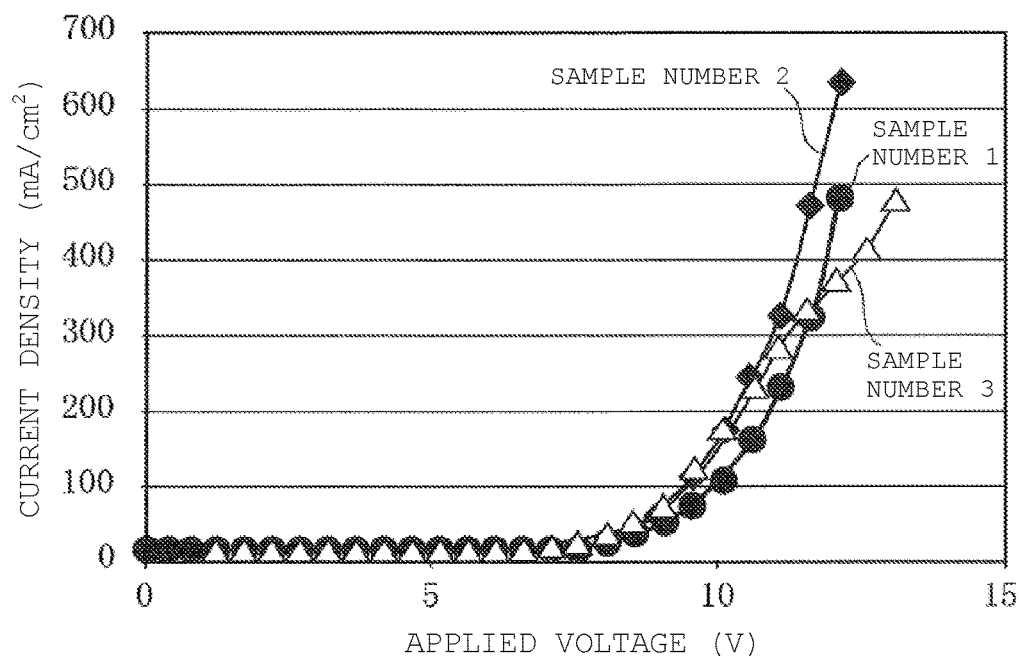
FIG. 12 is a diagram illustrating current density characteristics according to Example 1.

FIG. 12 is a diagram illustrating the relationship between the applied voltage and the current density, where the horizontal axis indicates the applied voltage (V), and the vertical axis indicates the current density (mA/cm²).

Figure 13:
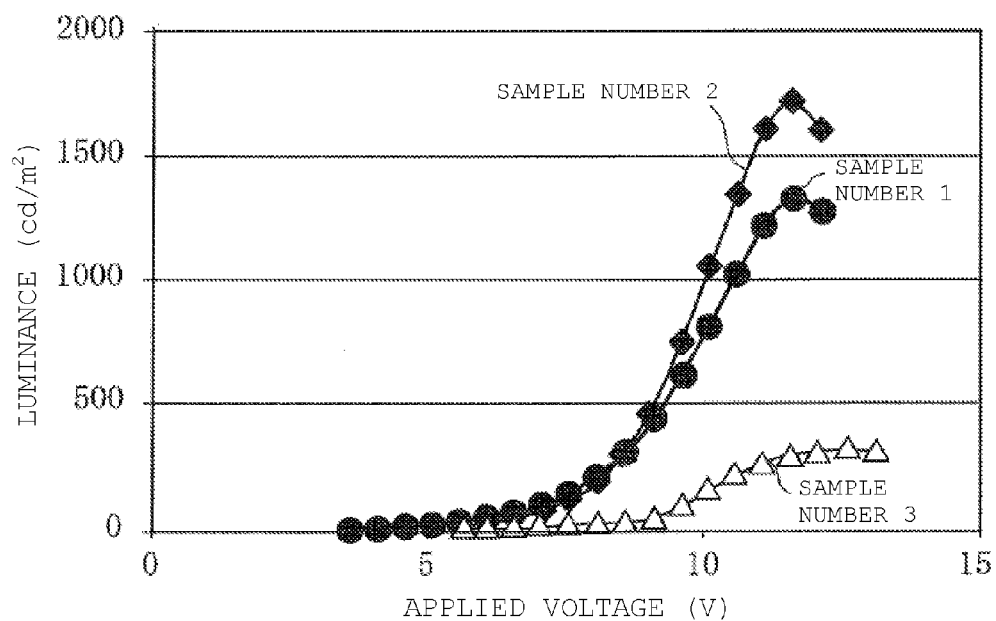
FIG. 13 is a diagram illustrating luminance characteristics according to Example 1.

FIG. 13 is a diagram illustrating luminance characteristics, where the horizontal axis indicates the applied voltage (V), and the vertical axis indicates the luminance (cd/m²).

Figure 14:
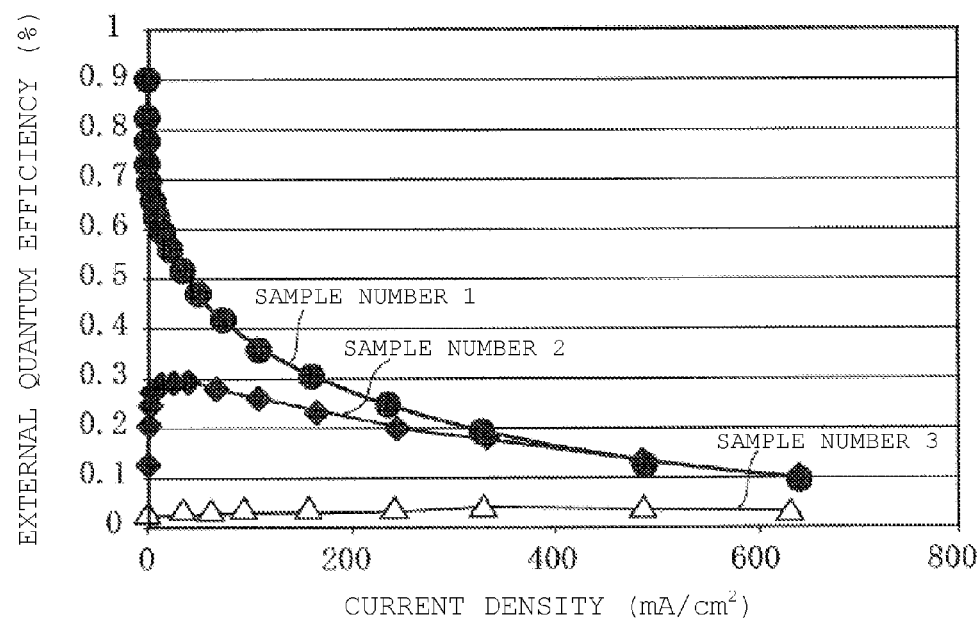
FIG. 14 is a diagram illustrating luminescent efficiency characteristics according to Example 1.

FIG. 14 is a diagram illustrating characteristics for luminescent efficiency, where the horizontal axis indicates the current density (mA/cm²), and the vertical axis indicates the external quantum efficiency (%).

In each of FIGS. 12 to 14, a mark ● refers to sample number 1 (shell part thickness: 3 ML), a mark ♦ refers to sample number 2 (shell part thickness: 1 ML), and a mark Δ refers to sample number 3 (shell part thickness: 0 ML).

Figure 15:
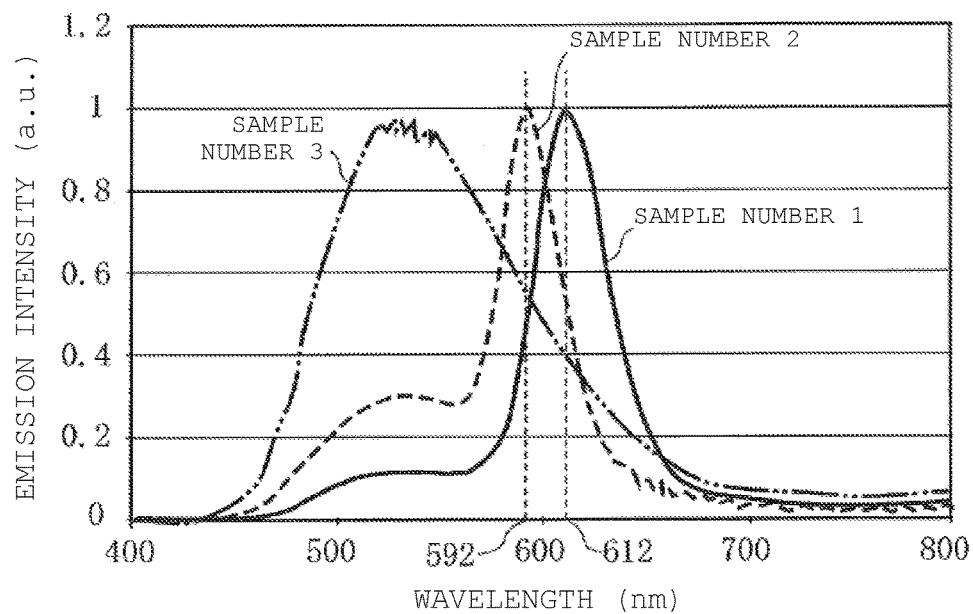
FIG. 15 is a diagram illustrating emission spectra according to Example 1.

FIG. 15 is a diagram illustrating emission spectra, where the horizontal axis indicates the wavelength (nm), and the vertical axis represents the emission intensity (a.u.). In the figure, a solid line refers to sample number 1, a dashed line refers to sample number 2, and a chain double-dashed line refers to sample number 3. It is to be noted that as for the emission intensity, the measurement results are normalized between 0 and 1 and illustrated.

Sample number 3 has quantum dots formed only from core parts, and thus the surfaces of the quantum dots had defects generated significantly, and for this reason, at the same drive voltage (applied voltage), the obtained current density was low (FIG. 12), and the luminance and the luminescent efficiency also became extremely low (FIG. 13, FIG. 14). In addition, it has been found that the emission spectrum also has a peak produced around the absorption wavelength range (535 nm) of Alq3 that is the electron transport layer, and desired emission characteristics through recombination of electrons and holes in the quantum dots cannot be obtained (FIG. 15).

In addition, since sample number 2 has the thin ZnS film (shell part) of 1 ML in thickness, sample number 2 enables driving at low voltages (FIG. 12), and also has favorable luminance characteristics (FIG. 13), but had an extremely low luminescent efficiency in a low current-density region (FIG. 14). In addition, it has been found that the emission spectrum has a peak that appears around 592 nm, but luminescence is also produced around 535 nm that is the absorption wavelength range of Alq3, and thus sample number 2 is poor in purity of luminescent color (FIG. 15). This is considered to be because some of holes injected into quantum dots leak to the outside without being recombined in the quantum dots, thereby also producing luminescence around the absorption wavelength range of the electron transport layer that is an adjacent layer.

In contrast, as for sample number 1, the ZnS film (shell part) has an adequate thickness of 3 ML, and the ZnS film exhibits a hole block function. Thus, it has been found that as compared with sample number 2, the drive voltage slightly increases (FIG. 12), and the luminance also slightly decreases (FIG. 13), but the recombination probability of holes and electrons in the quantum dots increases, and as a result, the luminescent efficiency improves dramatically (FIG. 14). In addition, since the leakage of holes to the outside is suppressed by the hole block function of the shell part as described above, it has been found that the emission spectrum also has a peak that appears around 612 nm that is the absorption wavelength range of the quantum dots, and luminescence reduces in the absorption wavelength range of the electron transport layer that is an adjacent layer, and a purity of luminescent color also improves (FIG. 15).

In such a manner, it has been found that the increase to 3 ML in thickness of the ZnS film (shell part) of the quantum dot (nanoparticle material) slightly increases the drive voltage, and slightly decreases the luminance, but dramatically improves the luminescent efficiency, and also improves the purity of luminescent color.

On the other hand, when the ZnS film of the quantum dot is made small in thickness of 1 ML, the injection efficiency of carriers into the quantum dot increases, thus making it possible to decrease the drive voltage, and also making it possible to slightly improve the luminance.

Accordingly, as in the second embodiment described above, the combination of the both is considered to make it possible to obtain a light-emitting device which is low in drive voltage, high in luminance and luminescent efficiency, and high in purity of luminescent color.

EXAMPLE 2

In accordance with the same method and procedure as in Example 1, a quantum dot dispersing solution with a shell part of 1 ML in thickness on the basis of the constituent molecule of the shell part was prepared.

Then, samples of sample numbers 11 to 13 were prepared in accordance with the same method and procedure as for sample number 1 except for varying the dropping amount of the quantum dot dispersing solution onto the hole transport layer.

Then, according to the observation of a cross section with a TEM for each sample of sample numbers 11 to 13, the thickness of the shell part was 1 ML on the basis of the constituent molecule of the shell part in each case, and thickness of the light-emitting layer was 1 ML for sample number 11, 2 ML for sample number 12, and 3 ML for sample number 13 on the basis of the particle size of the quantum dot.

Next, luminance characteristics and external quantum efficiency were determined in accordance with the same method and procedure as in Example 1.

Figure 16:
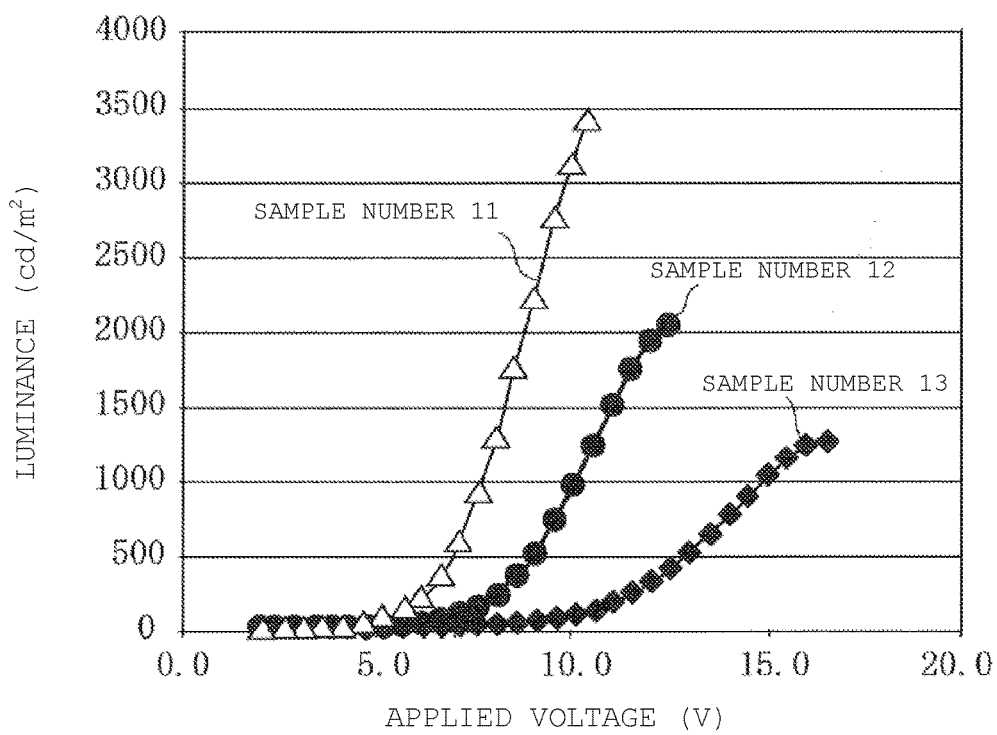
FIG. 16 is a diagram illustrating luminance characteristics according to Example 2.

FIG. 16 is a diagram illustrating luminance characteristics, where the horizontal axis indicates the applied voltage (V), and the vertical axis indicates the luminance (cd/m$^2$).

Figure 17:
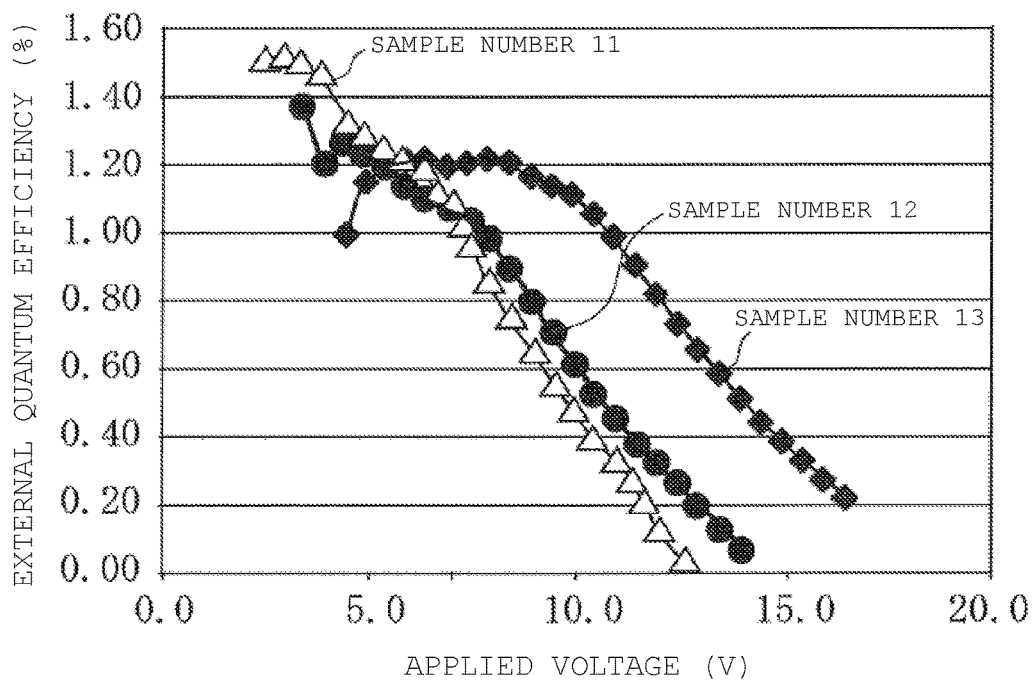
FIG. 17 is a diagram illustrating luminescent efficiency characteristics according to Example 2.
Figure 17:
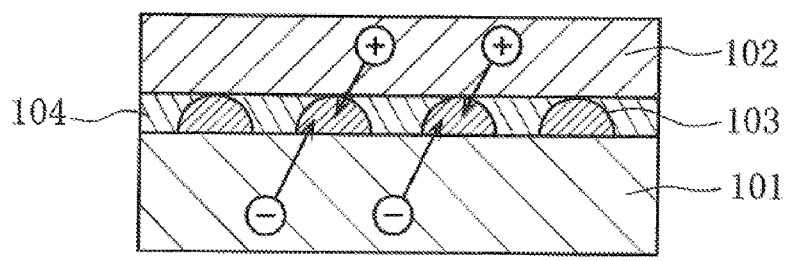

FIG. 17 is a diagram illustrating characteristics for luminescent efficiency, where the horizontal axis indicates the applied voltage (V), and the vertical axis indicates the external quantum efficiency (%).

In each of FIGS. 16 and 17, a mark Δ refers to sample number 11 (light-emitting layer thickness: 1 ML), a mark ● refers to sample number 12 (light-emitting layer thickness: 2 ML), and a mark ◆ refers to sample number 13 (light-emitting layer thickness: 4 ML).

As is clear from FIGS. 16 and 17, it has been found that the luminance and the luminescent efficiency decreases as the thickness of the light-emitting layer increases.

Then, it has been found that the thickness of the light-emitting layer is preferably 2 ML or less on the basis of the particle size of the quantum dot in order to obtain more favorable emission characteristics.

The leakage of holes injected into quantum dots (nanoparticle material) to the outside of the quantum dots is suppressed to make it possible to realize light-emitting devices such as EL elements improved in luminescent efficiency and purity of luminescent color.

DESCRIPTION OF REFERENCE SYMBOLS 4 hole transport layer
5 quantum dot (nanoparticle material)
6 light-emitting layer
7 electron transport layer
9 core part
10 shell part
11 surfactant
21 light-emitting layer
22 first quantum dot (nanoparticle material)
23 first light-emitting layer
24 second quantum dot
25 second light-emitting layer
26 core part
27 shell part
28 surfactant
29 core part
30 shell part
31 surfactant

The invention claimed is:

1. A light-emitting device comprising:
a hole transport layer;
an electron transport layer;
a first light-emitting layer interposed between the hole transport layer and the electron transport layer, the first light-emitting layer comprising first quantum dots, the first light-emitting layer being constructed to emit light when an electric current is injected into the first light-emitting layer, wherein the first quantum dots are a nanoparticle material comprising a first core part and a first shell part coating the first core part, the first shell part having a thickness of 3 to 5 monolayers of a constituent molecule of the first shell part; and
a second light-emitting layer, the second light-emitting layer comprising second quantum dots, the second light-emitting layer being constructed to emit light when the electric current is injected into the second light-emitting layer, wherein the second quantum dots are a nanoparticle material comprising a second core part and a second shell part coating the second core part, the second shell part having a thickness of less than 3 monolayers based on a constituent molecule of the second shell part,
the first light-emitting layer being disposed proximal to the electron transport layer relative to the second light-emitting layer, and the second light-emitting layer being disposed proximal to the hole transport layer relative to the first light-emitting layer, and
the first shell part has a greater thickness than the second shell part.

2. The light-emitting device according to claim 1, wherein the first shell part has a first energy level of a valence band on the basis of a vacuum level, and the first core part has a second energy level of a valence band on the basis of the vacuum level, the first energy level being lower than the second energy level.

3. The light-emitting device according to claim 1, wherein the first shell part has an energy level of a valence band on the basis of a vacuum level that is lower than a HOMO level of the electron transport layer.

4. The light-emitting device according to claim 1, wherein the first light-emitting layer has a thickness of 0.5 to 2 monolayers based on a particle size of the first quantum dots.

5. The light-emitting device according to claim 2, wherein the first light-emitting layer has a thickness of 0.5 to 2 monolayers based on a particle size of the first quantum dots.

6. The light-emitting device according to claim 3, wherein the first light-emitting layer has a thickness of 0.5 to 2 monolayers based on a particle size of the first quantum dots.

* * * * *